US006603182B1

(12) United States Patent
Low et al.

(10) Patent No.: US 6,603,182 B1
(45) Date of Patent: Aug. 5, 2003

(54) PACKAGING MICROMECHANICAL DEVICES

(75) Inventors: Yee Leng Low, Berkeley Heights, NJ (US); David Andrew Ramsey, Annandale, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/097,072

(22) Filed: Mar. 12, 2002

(51) Int. Cl.[7] .......................................... H01L 31/0232
(52) U.S. Cl. .................. 257/432; 257/434; 257/680; 257/686; 257/724; 257/729; 257/777; 257/784
(58) Field of Search ........................... 257/431, 432, 257/433, 434, 685, 686, 723, 724, 729, 738, 680, 777, 779, 784, 704; 438/109, 110, 116

(56) References Cited

U.S. PATENT DOCUMENTS

| | | | |
|---|---|---|---|
| 6,335,224 B1 | * | 1/2002 | Peterson et al. ............ 438/114 |
| 6,396,711 B1 | * | 5/2002 | Degani et al. .............. 361/760 |
| 6,433,411 B1 | * | 8/2002 | Degani et al. .............. 257/678 |
| 6,489,670 B1 | * | 12/2002 | Peterson et al. ............ 257/686 |
| 6,495,895 B1 | * | 12/2002 | Peterson et al. ............ 257/434 |
| 2003/0020094 A1 | * | 1/2003 | Shrauger ................... 257/200 |

FOREIGN PATENT DOCUMENTS

| | | | | |
|---|---|---|---|---|
| JP | 2002036200 A | * | 2/2002 | ............ B81B/7/02 |
| JP | 2002043449 A | * | 2/2002 | ........... H01L/23/02 |

* cited by examiner

Primary Examiner—Kamand Cuneo
Assistant Examiner—Alonzo Chambliss

(57) ABSTRACT

The specification describes a packaging arrangement for micro-electromechanical systems (MEMS). The MEMS devices are mounted on a ceramic platform and are then packaged in a hybrid package. The hybrid package may be hermetically sealed. The hybrid package uses a ceramic insert as the primary MEMS device enclosure. The ceramic insert is mounted on a polymer printed wiring board, which provides both support and electrical interconnection for the ceramic insert. Optical access to the MEMS device is through a transparent window that may be hermetically sealed to the ceramic insert. The use of a ceramic primary enclosure for the MEMS device array substantially eliminates thermomechanical instabilities and provides thermomechanical and hermetic performance for the elements that require it. The main interconnection and routing function, implemented using standard epoxy printed circuit technology, yields high interconnection versatility and performance at low cost.

7 Claims, 2 Drawing Sheets

PACKAGING MICROMECHANICAL DEVICES

FIELD OF THE INVENTION

This invention relates to electronic assembly technology and more specifically to packaging micro-electromechanical systems (MEMS) or micro-optoelectromechanical devices (MOEMS).

BACKGROUND OF THE INVENTION

New photonic devices are in development that use micromechanical elements. In principal, micromechanical elements can be built on a variety of platforms. However, the substrate of choice is typically a semiconductor wafer, e.g. silicon. Highly and often elegantly engineered silicon processing can be used to make new device structures that combine the mechanical and optical properties of silicon. An advanced technology, silicon optical bench technology, has been developed to implement this approach. Typically the micromechanical devices or subassemblies are formed in large integrated arrays, referred to here as MEMS, to perform a common function in a parallel mode. The substrate for the arrays is usually a silicon wafer or a large silicon chip. In most instances the MEMS device arrays comprise photonic devices, and are accessed with optical I/O signals.

Among the most promising of the photonic MEMS devices are optical cross connect devices. These may be used in optical networking for routing optical signals from one array of optical channels to another. Optical cross connects are typically made in the form of compact arrays of micromechanical mirrors. In an input array with a two dimensional, or 2-D, architecture usually a linear array of optical waveguides are arranged to address the mirror array, which steers optical beams from the input array to a corresponding output array of optical waveguides. The input and output optical channels may be optical waveguides in an optical integrated circuit, or may be arrays of optical fibers.

These optical cross connect devices can switch one of a large number of optical inputs between a selected one of a large number of optical outputs. For example, a 10 fiber input array used with a 10 fiber output array has the capacity to make 100 individual connections. Each channel typically has tens or, in future systems, hundreds of channels of wavelength division multiplexed (WDM) signals. The information handling capacity of such a switch is extremely large.

State of the art optical networking systems require large compact arrays of micromechanical mirrors. The micromechanical mirrors are electrically addressed, and mirror tilt is controlled by selectively applied electrostatic fields. In a standard optical networking system, for n input fibers in a 2-D implementation an $n^2$ mirror array is used. Each input fiber accesses an associated row of, for example, ten mirrors and each of the ten mirrors addresses one of ten output fibers. In a typical operating cross connect, for example, the first three mirrors are not activated, i.e. do not intersect the beam path, and the fourth is electrically tilted to intersect the beam path and steer the beam to its associated fiber. In this way the first fiber can address a selected one of ten mirrors and thus a selected one of ten fibers. This $n^2$ mirror array requires two tilt positions, on and off. A more efficient mirror arrangement uses 2n mirrors for the same 10×10 switch. It operates by steering the optical beam to one of ten positions, and has two way tilt capability.

Mirrors for optical cross connects in current state of the art devices may be formed using the silicon bench technology mentioned above. A silicon wafer platform is used as the support substrate, and the mirrors are fabricated on the silicon platform using known micromechanical device fabrication techniques. Some of these techniques have been developed for optical modulator devices such as the Mechanical Anti-Reflection Switch (MARS) device. See e.g. U.S. Pat. No. 5,943,155 issued Aug. 24, 1999, and U.S. Pat. No. 5,943,571, issued Sep. 7, 1999. The fabrication approach used in this technology is to fabricate a layered structure on a silicon substrate, with the top layer of a reflecting material, and dissolve away the intermediate layer(s) leaving a suspended reflector.

It should be evident from the foregoing description that optical alignment in MEMS assemblies, i.e. packaged MEMS device arrays, is extremely critical. Alignment defects occur during manufacture and also arise in the use environment, i.e. after manufacture. The former can be dealt with by process control and thorough testing. The latter however, are more abstruse and unpredictable. They may occur as the result of mechanical perturbations in the assembly caused, for example, by handling. More typically, they result from differential thermal expansion due to temperature variations in the use environment. This produces strains which may impair the precise alignment of optical elements in the assembly. To preserve critical alignment, the MEMS device arrays may be mounted in a robust container with a suitable transparent opening for accessing the array with light signals. In many cases it is desirable to mount them in hermetic packages. However these protective packages often exacerbate the thermo-mechanical problems caused by differential thermal expansion.

Use of standard epoxy/glass printed circuit boards for packaging MEMS devices has proven less than satisfactory. Large MEMS arrays require complex and efficient interconnection arrangements as well as demanding thermomechanical performance. As indicated above, thermomechanical performance is required in general for hermetic packages, and is particularly important for photonic devices that require precise optical alignment. Also, hermeticity can only be achieved using materials with sufficiently low diffusion rates for air and water vapor. Such materials are generally restricted to metals, glasses and ceramics. While epoxy printed circuit boards offer good interconnect capability, and at reasonable cost, the thermomechanical and hermetic properties of epoxy boards are less than desired for this application.

Ceramic chip carrier technology is typically the packaging technology of choice for high quality state of the art IC devices. It is especially suitable for hermetic packages, due to high thermomechanical performance and low diffusion rates. However, ceramic packaging is costly, especially where high density interconnection and routing is required.

SUMMARY OF THE INVENTION

We have developed a packaging technology for MEMS assemblies in which the MEMS device arrays are mounted on a ceramic platform and are then packaged in a hybrid package. The hybrid package may be hermetically sealed. The hybrid package uses a ceramic insert as the primary MEMS device enclosure. The ceramic insert is mounted on a polymer printed wiring board, which provides both support and electrical interconnection for the ceramic insert. Optical access to the MEMS device is through a transparent window hermetically sealed to the ceramic insert. The use of a ceramic primary enclosure for the MEMS device array substantially eliminates thermomechanical instabilities, and provides thermomechanical and hermetic performance for the elements that require it. The interconnection function of the package is implemented using standard epoxy printed circuit technology. This yields high interconnection performance at low cost.

DETAILED DESCRIPTION

The invention is directed to packaging assemblies for MEMS devices. These devices can be characterized as electromechanical, i.e. having moving elements, with electrical drive circuits for activating the moving elements. In the preferred case the electromechanical devices are optical devices and require precision alignment between an optical beam and one or more physical elements, typically the moving elements. As one example of these devices, the following describes an electromechanical mirror array, useful for optical cross connects in an optical switching system.

Figure 1:
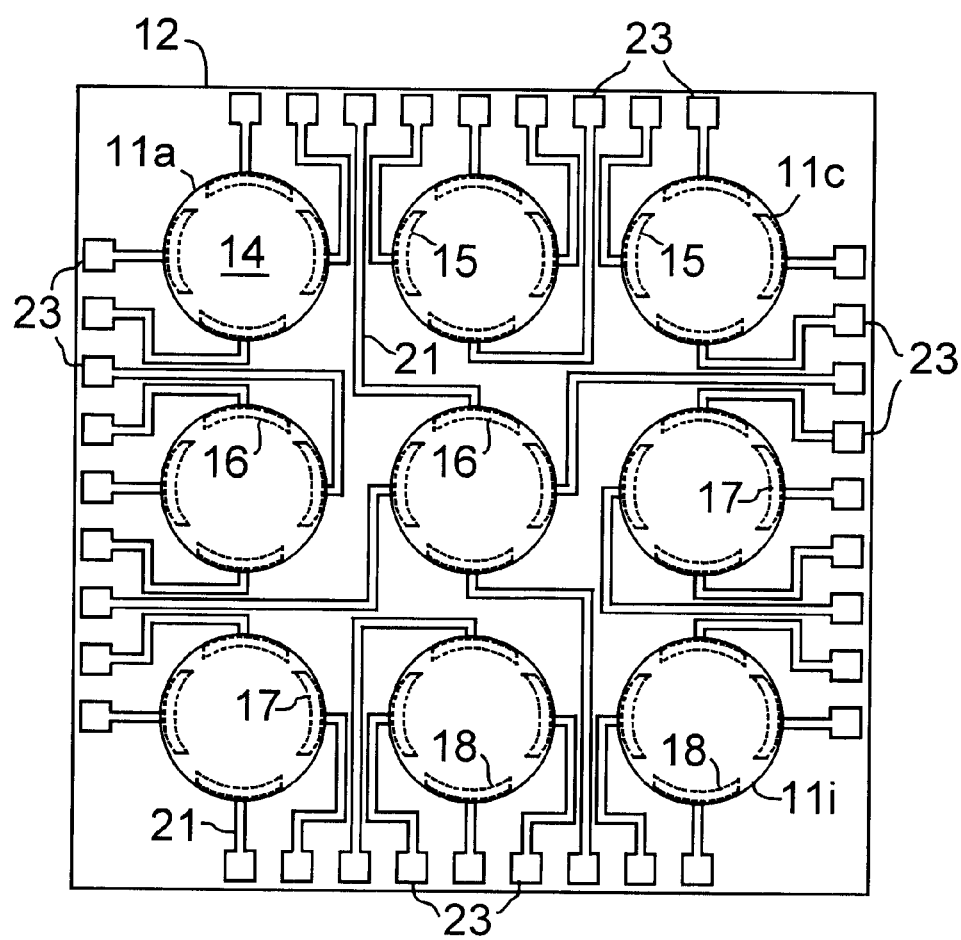
FIG. 1 is a schematic view of a MEMS device array, in this embodiment a mirror with four way tilt for an optical cross connect, that is presented by way of example of devices that may be packaged using the invention.

Referring to FIG. 1, a 3×3 micromechanical mirror array is shown by way of example of a MEMS device array that is advantageously packaged according to the invention. The 3×3 array of micromechanical devices comprises nine micromechanical mirrors, shown as 11a–11i, mounted on substrate 12. The substrate may be ceramic, or may be a silicon wafer. The individual mirror devices in the array comprise mirror surface 14, with four way tilt capability, and drive electrodes 15–18, shown in phantom. Control of the tilt is effected electrostatically by application of voltages selectively to electrodes 15–18. This normally requires that each of the four electrodes be independently addressable. Runners 21 interconnect the four electrodes for each device 11a–11i to bond pads 23. An array of n devices, requires 4n independent electrical interconnections. In principle, fewer electrical connections can be used, for example in a three electrode implementation, but the preferred choice is that shown. This interconnection requires a total of 36 individual runners and bond pads for the 3×3 array.

In an optical cross connect, the mirrors in the array communicate with optical beams in optical waveguides. The waveguides, and the overall system architecture, are not part of the invention and for simplicity in presenting the invention are not shown. However, it is well known that optical cross connects in the form of mirror arrays require compact mirror arrays, i.e., close packing of the mirrors, for efficient design of the overall system.

The size, 3×3, of the array is chosen here for convenience in illustrating the complexity and critical alignment needs for large micromechanical device arrays. Device arrays in current development may have hundreds or even thousands of micromechanical mirrors on a single silicon platform. As the number of micromechanical devices is multiplied, the potential for alignment problems and other mechanical defects rises dramatically.

The individual elements of the MEMS device, i.e. the mirrors in the embodiment shown, are shown circular in configuration. Alternatively, they may be square or rectangular.

The micromechanical mirror device is given by way of example only of a wide variety of electrically driven micromechanical elements that may be fabricated in large arrays on a common substrate. It is presented for illustration of the problems associated with integrating large micromechanical device arrays requiring mechanical movement and optical access.

Due to the obvious fragility of MEMS devices, they should be well protected from hostile ambients. For normal service environments they should be entirely enclosed and preferably hermetically sealed, while still allowing optical access. Due to the mechanical nature of MEMS devices, the package should provide mechanical integrity and dimensional stability. A package design providing these attributes is shown in FIG. 2.

Figure 2:
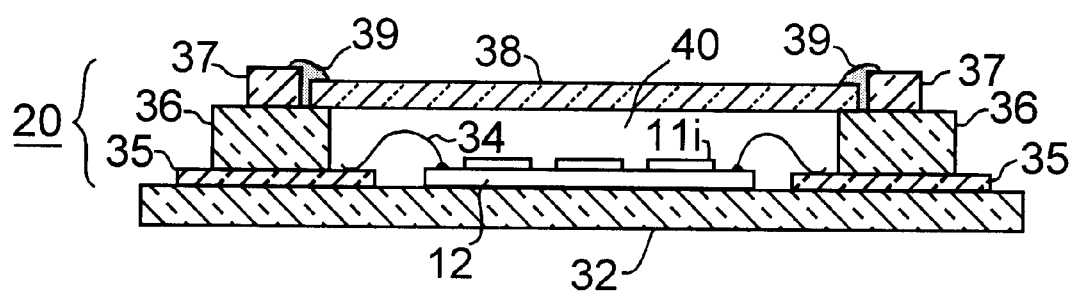
FIG. 2 is a schematic representation of a MEMS assembly comprising a silicon wafer platform and a ceramic insert as the primary chamber for enclosing the MEMS device array of FIG. 1.

In FIG. 2, the ceramic insert carrying the MEMS devices is shown generally at 20. The MEMS devices, e.g. 11i, are typically formed on a silicon substrate 12 as described in connection with FIG. 1. A ceramic substrate 32 supports the MEMS substrate 12. The ceramic material used for the ceramic insert may be selected from a variety of known ceramic materials used in integrated circuit technology, for example, alumina, beryllia, aluminum nitride, etc. It may also be a mixed ceramic/glass material as known in that art. Mixed materials, having essentially ceramic characteristics, can be tailored to provide desired mechanical properties, especially coefficient of thermal expansion. In general, the desirable thermomechanical properties of available ceramic materials recommends their use as the primary platform for a MEMS device.

Referring again to FIG. 2, the ceramic substrate 32 has ceramic layer 35, and support frames 36, 37 to support a transparent window. The combination of elements 36 and 37 provides a ledge, as shown in the figure, that supports the window 38. (The small separation between window 38 and support 37 is filled with a metal, solder, seam seal, or glass filler 39.) This assembly creates an hermetic chamber 40 for the MEMS device. The transparent window 38 may be any suitable material but is preferably a material with thermomechanical properties similar to those of the support frames 36, 37. A suitable example would be frames of Kovar® and a window 38 of sapphire. The MEMS platform 12 is bonded to substrate 32 and is electrically interconnected to ceramic element 35 using wire bonds 34 as an example. The wire bonds interconnect bond pads (23 in FIG. 1) to substrate pads (not shown) on elements 35 for connection to the next interconnect level. It will be understood by those skilled in the art that any of a variety of mounting schemes may be used, the one shown being a typical example. The electrical interconnection between MEMS device 12 and the substrate 32 can take many forms. With a silicon substrate, it is convenient to use standard IC interconnect technology. Typically this will comprise a grown or deposited oxide, and aluminum metallization interconnect patterns photolithographically formed on the oxide.

As mentioned above, the top of chamber 40 is capped with a transparent windowpane 38. The windowpane should be transparent to the wavelength used for the optical beams being deflected in the MEMS device. Typically this wavelength is 1.3 or 1.55 $\mu$m.

It should be evident to those skilled in the art that the size of the various elements in these figures are for convenience in illustrating the principles of the invention and are not necessarily to scale. The 3×3 array shown is for convenience in exposition. A more typical array, as suggested above, is 32×32 micromechanical devices on a 3.2 cm substrate, which allows an approximate single device size of 1 mm². Also, the array configuration, with x- and y-rows, is by way of example only. Other arrangements, e.g. with alternate rows offset and rows interleaved, may also be used.

Figure 3:
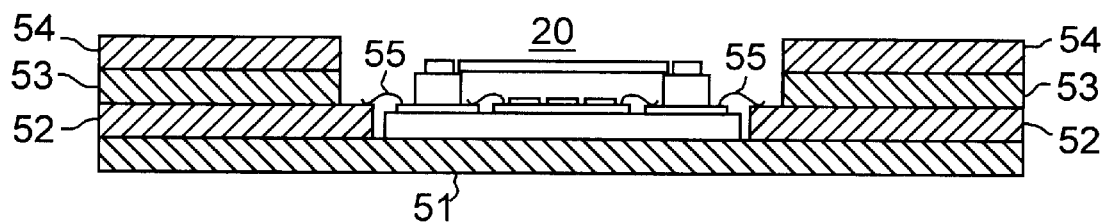
FIG. 3 is a schematic representation similar to that of FIG. 2 showing the combination of a ceramic insert and a polymer printed wiring board for interconnecting a MEMS assembly.

According to the invention, the ceramic insert 20 is then mounted on a polymer printed wiring board. A suitable arrangement is shown in FIG. 3, where the polymer printed wiring board is designated 51. The ceramic MEMS insert is shown at 20 and, in this embodiment, is interconnected to the printed wiring board using wire bonds 55. Because of the large number of interconnections for a MEMS device of the kind described here, the printed wiring board preferably has multilevel interconnection capability. This is represented in FIG. 3 by board levels 52–54. Level 52 has a ledge to accommodate wire bonds 55 to the ceramic assembly 20. A ledge may be formed on level 53 for additional wire bonds. The remaining structure allows significant fan-out and multilevel interconnections.

Figure 4:
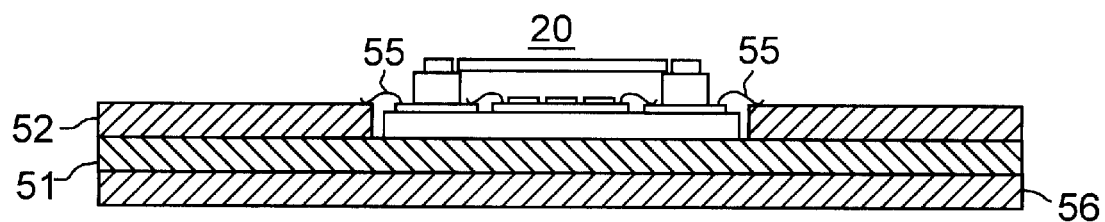
FIGS. 4 and 5 are optional arrangements similar to that of FIG. 3.

A wide variety of multilevel printed wiring boards are available and suitable for implementing the invention. For example, as an alternative to the arrangement shown in FIG. 3, the multilevels can be arranged below board level 51. An embodiment of this description is shown in FIG. 4 where board level 56 is used for added interconnection capability. More board levels may be used where needed. Multilevel boards allow for crossovers, as well as fan-out and added interconnections.

Figure 5:
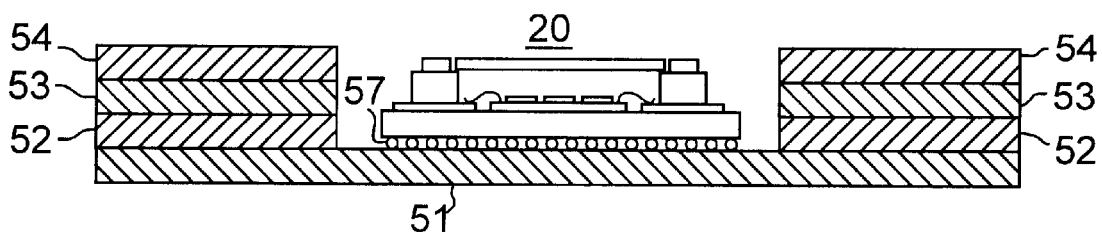

The ceramic insert 20 in FIGS. 3 and 4 is shown interconnected to the printed wiring board using wire bonds. Alternatively, this module may be interconnected using solder bump bonds. This arrangement is shown in FIG. 5, where solder bumps 57 attach and interconnect the ceramic insert 20 to the wiring board 51.

As indicated above, the advantage of these arrangements is that the primary container for the MEMS device is implemented in ceramic, which provides very high quality thermomechanical stability, especially for the optical access, i.e. the window, and the means for aligning the optical beam with the MEMS devices. The ceramic container also allows for a reliable hermetic seal.

Most of the interconnection of the MEMS devices is implemented with an epoxy-glass printed wiring board, which allows for high density reliable interconnection at low cost. The marriage of the two technologies provides optimization of the critical aspects of MEMS device fabrication, i.e. high thermomechanical stability, reliable hermeticity, and large numbers of low cost interconnections.

To further enhance mechanical isolation of the ceramic insert 20 of FIG. 2 from external mechanical stress, especially stresses from the complex interconnection system, the interconnections between the ceramic insert and the wiring board may be made using a floating contact pin array.

In the embodiment represented by FIG. 1, the MEMS array, here a mirror array, is formed or mounted on the top surface of the ceramic or silicon substrate. For some device arrays, devices that are already essentially complete may be attached to the substrate. In other embodiments the device array may be formed, i.e. built, on the substrate. In either case, referred to generically as forming the MEMS device on the top side of the ceramic or silicon substrate, electrical contacts associated with the device array may be interconnected typically by printed circuit runners to conductive vias on the top side of the ceramic substrate. An interconnection pattern, formed on the bottom side of the substrate, is interconnected to the bottom side of the vias. As shown above, this arrangement can be used to eliminate the wire bond interconnections between the ceramic insert and the printed wiring board.

In the embodiments described above, the MEMS device is formed on just one side of the substrate with the other side of the substrate comprising interconnection means. However, embodiments can be envisioned wherein micromechanical elements are provided on both sides of the substrate. Also, two substrates with micromechanical arrays as described may be arranged in a chip-on-chip configuration. The chip-on-chip arrangement, in the case where the micromechanical array is optically active, i.e. has an optical input/output, should be configured to allow optical access to the optical device array.

For the purpose of defining the invention described above the term "printed wiring board" is used to distinguish the primary interconnection means from ceramic substrates used, e.g., in the ceramic insert. The printed wiring board will typically be formed of a polymer material, e.g., epoxy.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A micro-electromechanical (MEMS) assembly comprising:
   (a) a polymer printed wiring board,
   (b) a ceramic insert mounted on the polymer printed wiring board, the ceramic insert comprising:
       (i) a ceramic substrate with a top and bottom surface,
       (ii) ceramic sidewalls attached to the top surface of the ceramic substrate, the ceramic sidewalls combining with the ceramic substrate to form a ceramic chamber,
       (iii) a MEMS device mounted on the top surface of the ceramic substrate within the ceramic chamber,
       (iv) a chamber top mounted on the ceramic sidewalls of the ceramic chamber, the chamber top comprising a transparent window,
       (v) means for hermetically sealing the chamber top to the ceramic chamber,
   (c) interconnecting means for interconnecting the ceramic insert and the polymer printed wiring board.

2. The MEMS assembly of claim 1 wherein the interconnecting means comprise wire bonds.

3. The MEMS assembly of claim 1 wherein the interconnecting means are solder bumps.

4. The MEMS assembly of claim 1 further including means for projecting an optical beam through the transparent window onto the MEMS device.

5. The MEMS assembly of claim 1 wherein the printed wiring board comprises epoxy-glass.

6. The MEMS assembly of claim 1 wherein the printed wiring board has multilevel interconnections.

7. The MEMS assembly of claim 6 wherein the printed wiring board has a recess formed in the central region thereof, and the ceramic insert and the MEMS device are contained within the recess.

* * * * *